(12) United States Patent
Cho et al.

(10) Patent No.: US 10,801,107 B2
(45) Date of Patent: Oct. 13, 2020

(54) APPARATUS FOR COLLECTING BY-PRODUCT IN SEMICONDUCTOR PROCESS

(71) Applicant: MILAEBO CO., LTD., Pyeongtaek-si, Gyeonggi-do (KR)

(72) Inventors: Che Hoo Cho, Seongnam-si (KR); Kyung Tae Kim, Suwon-si (KR); Myung Pil Han, Yongin-si (KR); Myoung Hoon Jung, Osan-si (KR)

(73) Assignee: MILAEBO CO., LTD., Pyeongtaek-si, Gyeonggi-do (KR)

( * ) Notice: Subject to any disclaimer, the term of this patent is extended or adjusted under 35 U.S.C. 154(b) by 125 days.

(21) Appl. No.: 16/234,372

(22) Filed: Dec. 27, 2018

(65) Prior Publication Data

US 2019/0194804 A1   Jun. 27, 2019

(30) Foreign Application Priority Data

Dec. 27, 2017   (KR) .......................... 10-2017-0180745

(51) Int. Cl.
*C23C 16/40* (2006.01)
*C23C 16/44* (2006.01)
*H01L 21/67* (2006.01)

(52) U.S. Cl.
CPC .... *C23C 16/4412* (2013.01); *H01L 21/67017* (2013.01); *H01L 21/67098* (2013.01)

(58) Field of Classification Search
CPC ........... C23C 16/4412; H01L 21/67017; H01L 21/67098; H01L 21/67; H01L 21/67011; B01D 45/08; B01D 45/00
USPC ....................................... 118/715; 156/345.1
See application file for complete search history.

(56) References Cited

U.S. PATENT DOCUMENTS

| | | | | |
|---|---|---|---|---|
| 5,820,641 A * | 10/1998 | Gu | ....................... | B01D 5/0006 55/434.4 |
| 6,197,119 B1 * | 3/2001 | Dozoretz | ............. | B01D 5/0036 118/715 |
| 2001/0017080 A1 * | 8/2001 | Dozoretz | ............. | B01D 5/0036 96/108 |

FOREIGN PATENT DOCUMENTS

| | | |
|---|---|---|
| KR | 10-0647725 B1 | 11/2006 |
| KR | 10-0676927 B1 | 2/2007 |
| KR | 10-1024504 B1 | 3/2011 |
| KR | 10-1057086 B1 | 8/2011 |

* cited by examiner

*Primary Examiner* — Rudy Zervigon
(74) *Attorney, Agent, or Firm* — Rabin & Berdo, P.C.

(57) ABSTRACT

Disclosed is an apparatus for collecting a by-product in a semiconductor process, the apparatus including: a housing; a heater plate; a heater power supply unit; first and second upper horizontal brackets collecting a by-product; a by-product collecting tower allowing the exhaust gas to pass through an exhaust gas passing space and collecting the by-product; the lower horizontal bracket guiding the exhaust gas toward the window and collecting the by-product contained in the exhaust gas; the window blocking the powder form by-product from introducing to a gas collecting and discharging port and guiding the exhaust gas thereto; and the gas collecting and discharging port. Accordingly, the apparatus can increase capacity of collecting a by-product with a simple structure, thereby extending a replacement period of the apparatus. In addition, the apparatus can collect a large amount of by-products quickly and efficiently over a long period of time.

7 Claims, 12 Drawing Sheets

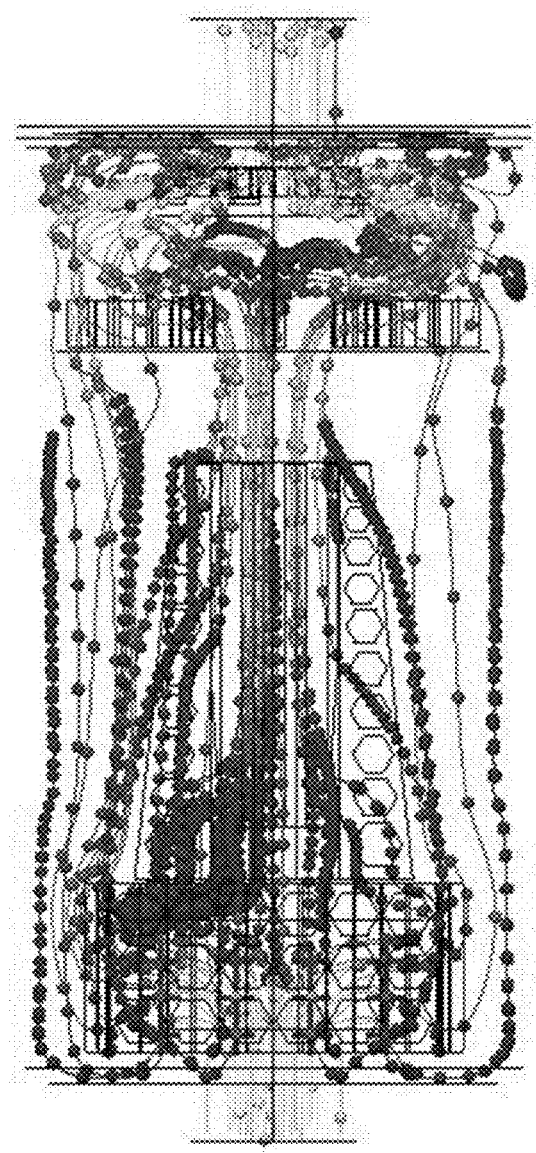
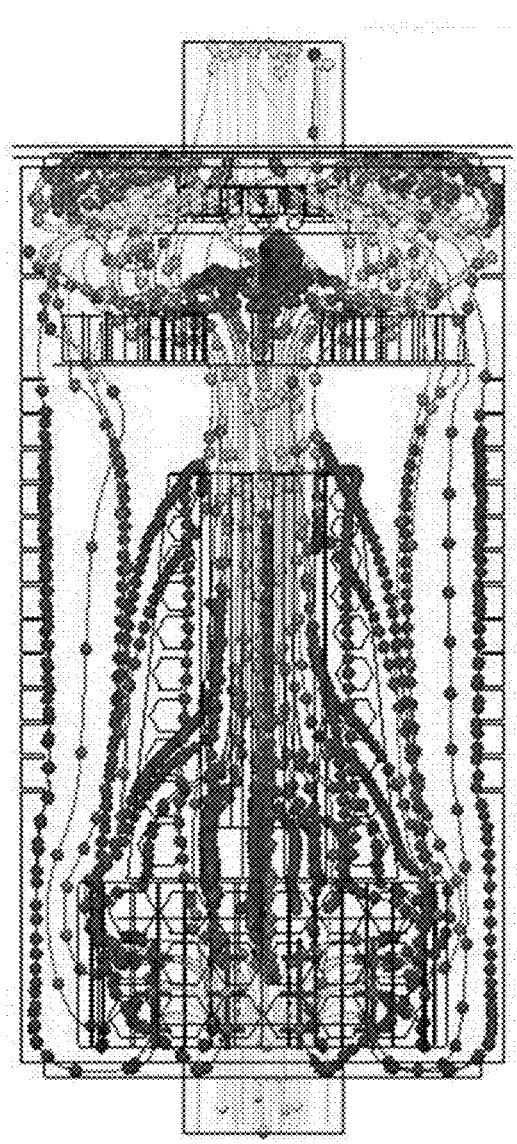
FIG. 7A
FIG. 7B

APPARATUS FOR COLLECTING BY-PRODUCT IN SEMICONDUCTOR PROCESS

CROSS REFERENCE TO RELATED APPLICATION

The present application claims priority to Korean Patent Application No. 10-2017-0180745, filed Dec. 27, 2017, the entire contents of which is incorporated herein for all purposes by this reference.

BACKGROUND OF THE INVENTION

Field of the Invention

The present invention relates to an apparatus for collecting a by-product in a semiconductor process. More particularly, the present invention relates to an apparatus for collecting a by-product in a semiconductor process, the apparatus efficiently collecting a large amount of by-products contained in gas exhausted from a process chamber in a semiconductor device manufacturing process and treating the by-products safely.

Description of the Related Art

Generally, a semiconductor manufacturing process is roughly classified into a fabrication process and an assembly process. The fabrication process is a process for manufacturing a chip in which a thin film is deposited on a wafer in various process chambers and a process of selectively etching the deposited thin film is repeatedly performed to process a predetermined pattern. The assembly process is a process of separating the chip manufactured in the fabrication process, and then joining the chip with the lead frame to assemble into the finished product.

Here, a process of depositing a thin film on the wafer or etching a thin film deposited on the wafer is performed at a high temperature in a process chamber with which hazardous gases such as silane, arsine, boron chloride, and process gases such as hydrogen gas are filled. During the process, a large amount of various ignitable gases and hazardous gases containing corrosive foreign substances and toxic components are produced in the process chamber.

Therefore, in the semiconductor manufacturing equipment, a scrubber for purifying an exhaust gas discharged from the process chamber and discharging the exhaust gas to the atmosphere is installed at a rear end of a vacuum pump, which brings the process chamber into a vacuum state.

The exhaust gas discharged from the process chamber is solidified and changes into powder when coming into contact with the atmosphere or when the ambient temperature is low. However, the powder is adhered to an exhaust line such that an exhaust pressure is raised. In addition, when the powder is introduced into the vacuum pump, the powder causes a failure of the vacuum pump and causes the exhaust gas to flow backward, thereby contaminating a wafer in the process chamber.

In order to solve the above problems, as shown in FIG. 10, a powder trap device is provided between a process chamber 1 and a vacuum pump 3 adhering the exhaust gas discharged from the process chamber 1 in a powder state.

As shown in FIG. 10, the process chamber 1 and the vacuum pump 3 are connected to each other through a pumping line, and a trap tube 7 trapping and accumulating by-products produced in the process chamber 1 in a powder form is provided on a position being branched from the pumping line 2.

In such a conventional powder trap device, unreacted gas produced during the deposition or etching of the thin film in the process chamber 1 is introduced toward the pumping line 2 having a relatively low temperature as compared with the process chamber 1. Thus, the gas is solidified into powder 9 and accumulated in the trap tube 7, which is provided on a position being branched from the pumping line 2.

Accordingly, in order to solve the above-mentioned problems of the related art, the applicant has developed by-product collecting apparatuses of a semiconductor apparatus and disclosed in Korean Patent Nos. 10-0647725 and 10-0676927.

However, the by-product collecting apparatuses have the following problems.

First, because a collection area (space) of a trap tube filled with powder is very small, the number of stoppages of an operation of the process chamber is increased, leading to an increase in waiting time of the process chamber for removing the powder accumulated in the trap tube. As a result, a turnaround time (TAT) is increased, which causes a decrease in productivity and an increase in product price, and shortens a trap tube cleaning cycle.

Second, a thin film deposition method is changed from chemical vapor deposition (CVD) to atomic layer deposition (ALD) due to the integration of semiconductor process, and precursors used are diversified and source usage increases. This increases the amount of unreacted by-products and requires a trap capable of collecting a large amount of by-products. A conventional low-capacity collecting apparatus has problems due to an increase in the number of stoppages of the operation of the process chamber for cleaning, and thus there is a demand for a large-capacity by-product collecting apparatus, which is capable of increasing a cleaning cycle.

However, when simply enlarging the by-product collecting apparatuses disclosed in the above-mentioned Korean Patent Nos. 10-0647725 and 10-0676927, there are problems in that it is difficult to manufacture a spiral plate, leading to an increase in manufacturing cost. In addition, a double housing is applied in the apparatus due to a housing coolant and thus the manufacturing cost of the tube increases as a tube, which is a material of the cylindrical housing, becomes larger. Furthermore, an actual collection space of the apparatus is reduced due to the complicated inner structure compared to the total area.

DOCUMENTS OF RELATED ART (Patent Document 1) Korean Patent No. 10-0647725, registered on Nov. 13, 2006;
(Patent Document 2) Korean Patent No. 10-0676927, registered on Jan. 25, 2007;
(Patent Document 3) Korean Patent No. 10-1024504, issued on Mar. 17, 2011;
(Patent Document 4) Korean Patent No. 10-1057086, registered on Aug. 9, 2011)

SUMMARY OF THE INVENTION

Accordingly, the present invention has been made keeping in mind the above problems occurring in the related art, and the present invention is intended to propose an apparatus for collecting a by-product in a semiconductor process, the apparatus modified to have a simple structure and increase capacity of collecting a by-product greatly such that a replacement period of the apparatus in a semiconductor manufacturing apparatus can be extended, and collecting a large amount of by-products quickly and efficiently over a long period of time such that the productivity and reliability of semiconductor manufacturing can be greatly improved.

In order to achieve the above object, there is provided an apparatus for collecting a by-product in a semiconductor process, the apparatus provided on a line between a process chamber and a vacuum pump to collect a by-product in an exhaust gas, which is produced in the process chamber, the apparatus including: a housing provided with a gas inlet and a gas outlet respectively provided on an upper plate and a lower plate, which are detachably coupled to upper and lower openings respectively, and configured with a passage through which gas exhausted from the process chamber flows; a heater plate made of ceramic or inconel material, provided with multiple heat-dissipation fins, which are arranged radially with respect to a vertical direction, provided on a bottom surface of the upper plate, and heating an exhaust gas to supply energy required for chemically changing the exhaust gas introduced through the gas inlet of the upper plate and distributing the exhaust gas evenly inside the housing; a heater power supply unit provided at a side of the upper plate of the housing to supply a power to the heater plate; a first upper horizontal bracket having multiple by-product collecting members, which are fixed on an upper surface of a quadrangular plate having a relatively large-diameter vertical mass gas passing opening at the center thereof in a radial direction with respect to the center point, allowing most of the exhaust gas introduced to the housing through the gas inlet of the upper plate to pass therethrough in the vertical direction, partly distributing the remaining exhaust gas evenly in the horizontal direction, and collecting a part of the by-product in a powder form; a second upper horizontal bracket having multiple minute gas passing holes, which have a relatively small diameter and formed at an outer circumference of a relatively large-area vertical mass gas passing opening formed at the center thereof, disposed to be spaced apart a predetermined distance from the bottom of the first upper horizontal bracket by multiple supporters to evenly distribute the exhaust gas introduced through the first upper horizontal bracket in the horizontal and vertical directions and to collect a part of the by-product in a powder form; a by-product collecting tower having a pyramid shape whose four sides are inclined in which isosceles trapezoidal shaped-multiple first and second directional vertical plates having multiple vertical gas passing holes formed only on a portion exposed to the outside when the vertical plates are engaged with each other are assembled in a lattice form in a manner that intersects each other in a direction of 90 degrees by connecting pieces partly left in bottom portions thereof for engagement, having a structure in which an exhaust gas passing space is formed into a hollow in most of a central upper portion of the by-product collecting tower, disposed between the second upper horizontal bracket and a lower horizontal bracket to allow most of the exhaust gas introduced through the second upper horizontal bracket to pass through the exhaust gas passing space and to allow the remaining exhaust gas to flow on the isosceles trapezoidal shaped-multiple first and second directional vertical plates, and collecting a part of the by-product in a powder form; the lower horizontal bracket having multiple rectangular shaped-gas holes formed in a number of rows in horizontal and vertical directions, provided fixedly between a lower surface of the by-product collecting tower and an upper surface of a window, guiding the exhaust gas vertically introduced through the by-product collecting tower toward the window, and collecting a part of the by-product contained in the exhaust gas in a powder form; the window having a structure in which four rectangular plates having multiple gas suction holes are assembled in a rectangular shape with upper and lower surfaces opened, configured such that an upper opening thereof is fixed to the lower horizontal bracket and a bottom surface thereof is spaced a predetermined distance apart from the lower plate of the housing by the multiple supporters, and having an exhaust gas vertical flow-in blocking plate to prevent the exhaust gas passing through the lower horizontal bracket from flowing directly toward a gas collecting and discharging port in the horizontal direction at an upper portion of the supporters such that the by-product that passes through the by-product collecting tower and the lower horizontal bracket or flows in the lateral direction through the inner space of the housing and then is converted into the powder form is blocked from directly introducing toward the gas collecting and discharging port and only the exhaust gas is guided toward the gas collecting and discharging port; and the gas collecting and discharging port disposed vertically between the inside of the window and a gas discharge opening provided on the lower plate of the housing, and collecting the exhaust gas introduced through the gas holes of the lower horizontal bracket, through the gas suction holes of the window, and through a gap between the bottom of the window and the lower plate of the housing to discharge outside.

The apparatus may further include: multiple minute gas passing holes, which have a diameter smaller than that of the vertical mass gas passing opening provided on the center of the quadrangular plate, on the quadrangular plate of the first upper horizontal bracket such that a part of the exhaust gas flowing horizontally along the upper surface of the quadrangular plate of the first upper horizontal bracket flows toward the second upper horizontal bracket and the by-product collecting tower through the multiple minute gas passing holes.

The by-product collecting members disposed on the upper surface of the first upper horizontal bracket may include: multiple gas flow guiding plates radially arranged in a vertically erected state; and multiple by-product collecting plates crossed at right angles to the gas flow guide plates while being spaced at a predetermined distance from one another.

With respect to the isosceles trapezoidal shaped-multiple first and second directional vertical plates constituting the by-product collecting tower, U-shaped multiple by-product collecting augmenting grooves may be provided between upper ends and the connecting pieces of two first and second directional vertical plates disposed on the front and back sides, and left and right sides, while keeping a predetermined distance to each other; each U-shaped exhaust gas passage groove may be provided between upper ends and the connecting pieces of two first and second directional vertical plates disposed on the inner side; a notch for inserting the second vertical plate may be vertically upwardly formed from the bottom of the first vertical plates while keeping a predetermined distance one to another; and a notch for inserting the first vertical plate may be vertically downwardly formed at a predetermined distance from the top of the second vertical plates while keeping a predetermined distance one to another.

The apparatus may further include: multiple by-product collecting augmenting plates fixedly provided on the four sides of the window, which has the multiple gas suction holes, in a vertical direction while keeping a predetermined distance one to another, wherein the by-product collecting augmenting plates are disposed to be perpendicular to outer surfaces of the four sides of the window.

The apparatus may further include: a cooling pipe through which a coolant flows embedded inside the upper plate of the housing, and a coolant inlet and a coolant outlet connected to both ends of the cooling pipe respectively and provided on an upper surface of the upper plate such that the upper plate is prevented from being overheated due to heat produced from the heater plate, whereby a sealing or a gasket provided between upper surface of the housing and the bottom surface of the upper plate is prevented from being damaged and the by-product powder is collected on the bottom surface of the upper plate.

The apparatus may further include: multiple vortex generating plates, which are installed at a predetermined height from an inner wall of the housing in the vertical direction in order to allow the exhaust gas passing through the inside of the housing to vortex.

The vortex generating plates may be formed to have a side cross-sectional surface among shapes of "-", "", "", "", and "".

In addition, multiple legs, each having a height adjusting bolt/support, may be provided at a lower end of the bottom surface of the lower plate of the housing in the vertical direction.

In addition, multiple housing deformation preventing rings may be further provided on an outer surface of the housing while keeping a predetermined distance to each other on the vertical direction, in order to prevent the shape of the housing having a predetermined volume from being deformed by a suction force generated in operation of a vacuum pump.

In addition, a pair of handles may be further provided on front and rear surfaces, or both side surfaces of the housing.

As described above, there is provided the apparatus for collecting a by-product in a semiconductor process of the present invention, the apparatus including: the housing formed into a relatively large volume rectangle in which the upper and lower openings are closed by the upper plate and lower plate respectively provided with the gas inlet and the gas outlet; the heater plate provided on the bottom surface of the upper plate to heat the exhaust gas and distribute evenly; the first upper horizontal bracket and the second upper horizontal bracket provided at an upper portion of the housing; the by-product collecting tower provided below the second upper horizontal bracket, having the pyramid shape whose four sides are inclined in which the isosceles trapezoidal shaped-multiple first and second directional vertical plates are assembled in the lattice form in a manner that intersects each other in a direction of 90 degrees by the connecting pieces partly left in the bottom portions thereof for engagement, having the structure in which the exhaust gas passing space is formed into the hollow in most of the central upper portion of the by-product collecting tower, allowing most of the exhaust gas introduced through the second upper horizontal bracket to pass through the exhaust gas passing space and allowing the remaining exhaust gas to flow on the isosceles trapezoidal shaped-multiple first and second directional vertical plates, and collecting a part of the by-product in a powder form; the lower horizontal bracket provided below the by-product collecting tower; the window provided below the lower horizontal bracket and having the structure in which the four rectangular plates having the multiple gas suction holes are assembled in the rectangular shape; the gas collecting and discharging port disposed between the inside of the window and the gas discharge opening of the lower plate, whereby the apparatus of the present invention can increase capacity of collecting a by-product greatly with a simple structure, thereby extending a replacement period of the apparatus in a semiconductor manufacturing apparatus. In addition, the apparatus can collect a large amount of by-products quickly and efficiently over a long period of time. As a result, the efficiency of collecting various kinds of by-products produced in semiconductor manufacturing, and the productivity and reliability of semiconductor manufacturing can be greatly improved.

BRIEF DESCRIPTION OF THE DRAWINGS

The above and other objects, features and other advantages of the present invention will be more clearly understood from the following detailed description when taken in conjunction with the accompanying drawings, in which:

FIGS. 7A and 7B are a side view and a front view respectively illustrating an exhaust gas flow diagram in which an exhaust gas flows and is vortexed in an evenly distributed manner and by-products are collected in the apparatus for collecting a by-product in a semiconductor process according to the present invention;

DETAILED DESCRIPTION OF THE INVENTION

Hereinafter, exemplary embodiments of the present invention will be described in detail with reference to the accompanying drawings.

However, in the following description, it is to be noted that, when the functions of conventional elements and the detailed description of elements related with the present invention may make the gist of the present invention unclear, a detailed description of those elements will be omitted.

Figure 1:
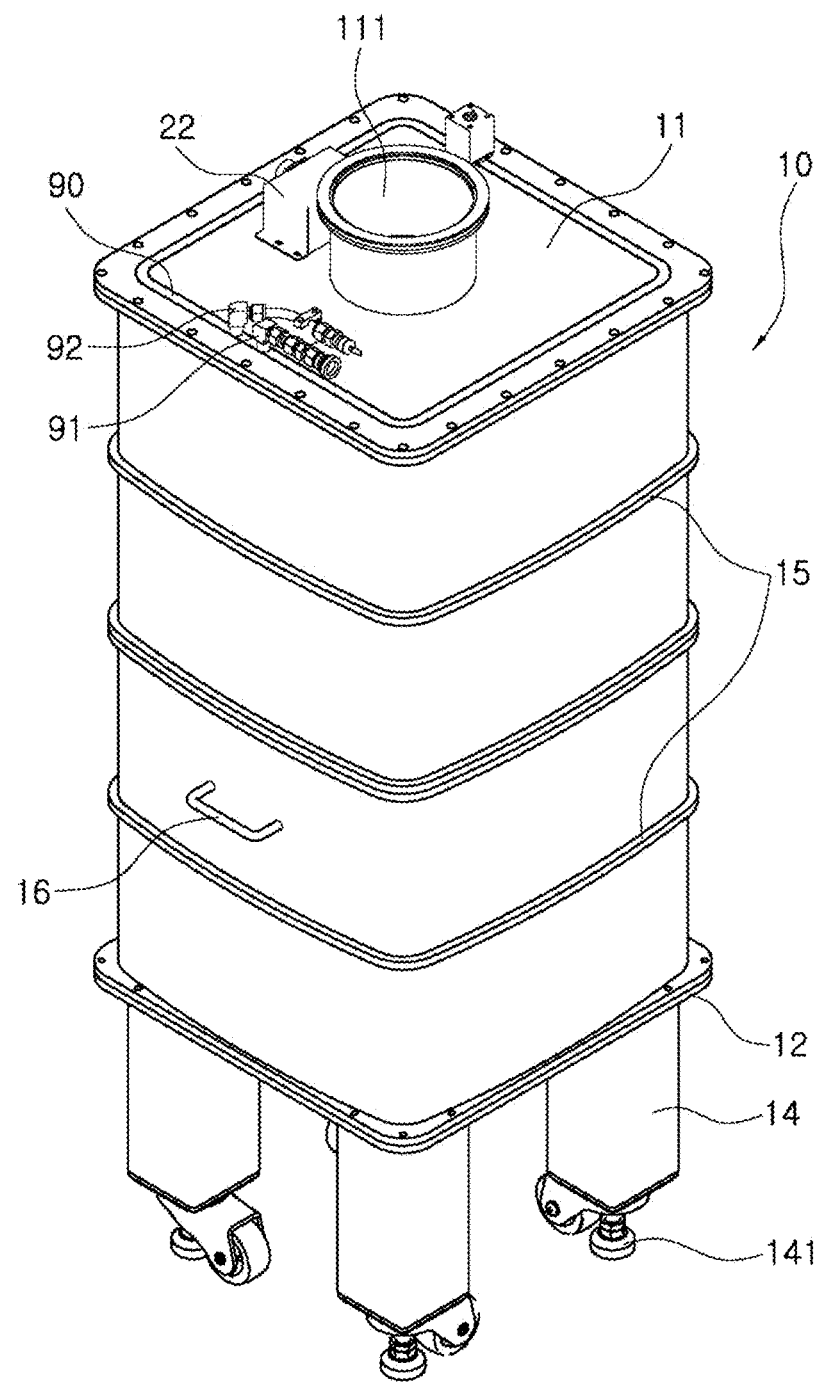
FIG. 1 is a perspective view illustrating an apparatus for collecting a by-product in a semiconductor process according to the present invention.
Figure 2:
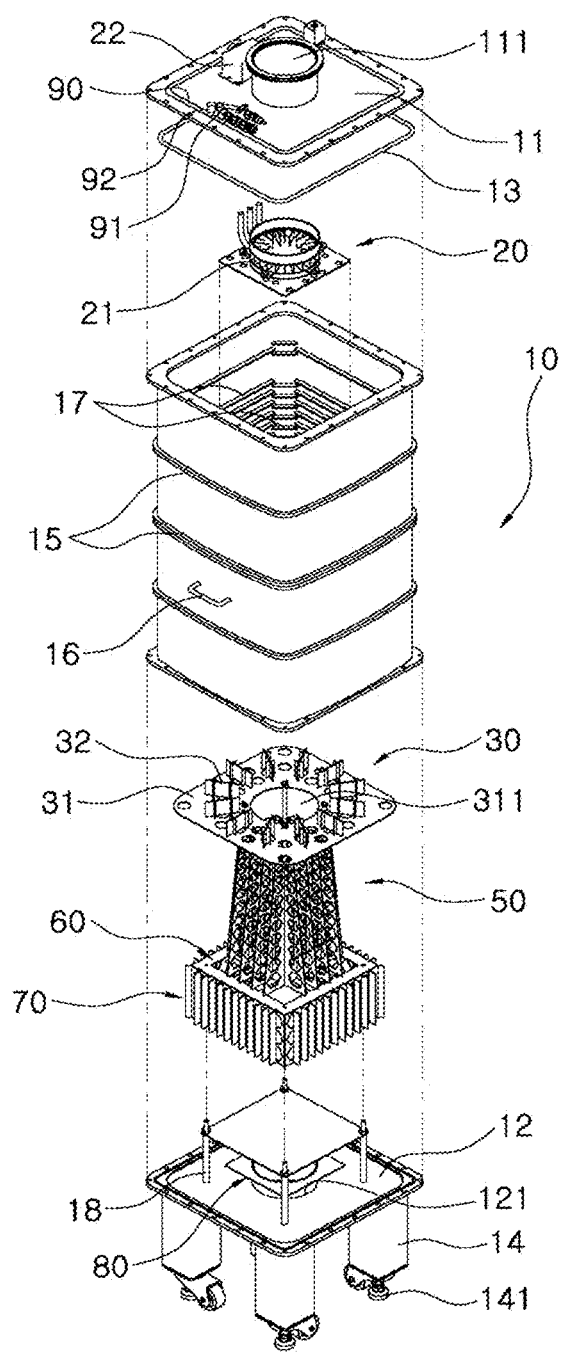
FIG. 2 is an exploded-perspective view illustrating the apparatus for collecting a by-product in a semiconductor process according to the present invention.

FIG. 1 is a perspective view illustrating an apparatus for collecting a by-product in a semiconductor process according to the present invention; FIG. 2 is an exploded-perspective view illustrating the apparatus for collecting a by-product in a semiconductor process according to the present invention; and FIG. is an exploded-perspective view partly illustrating the apparatus for collecting a by-product in a semiconductor process according to the present invention.

Figure 4:
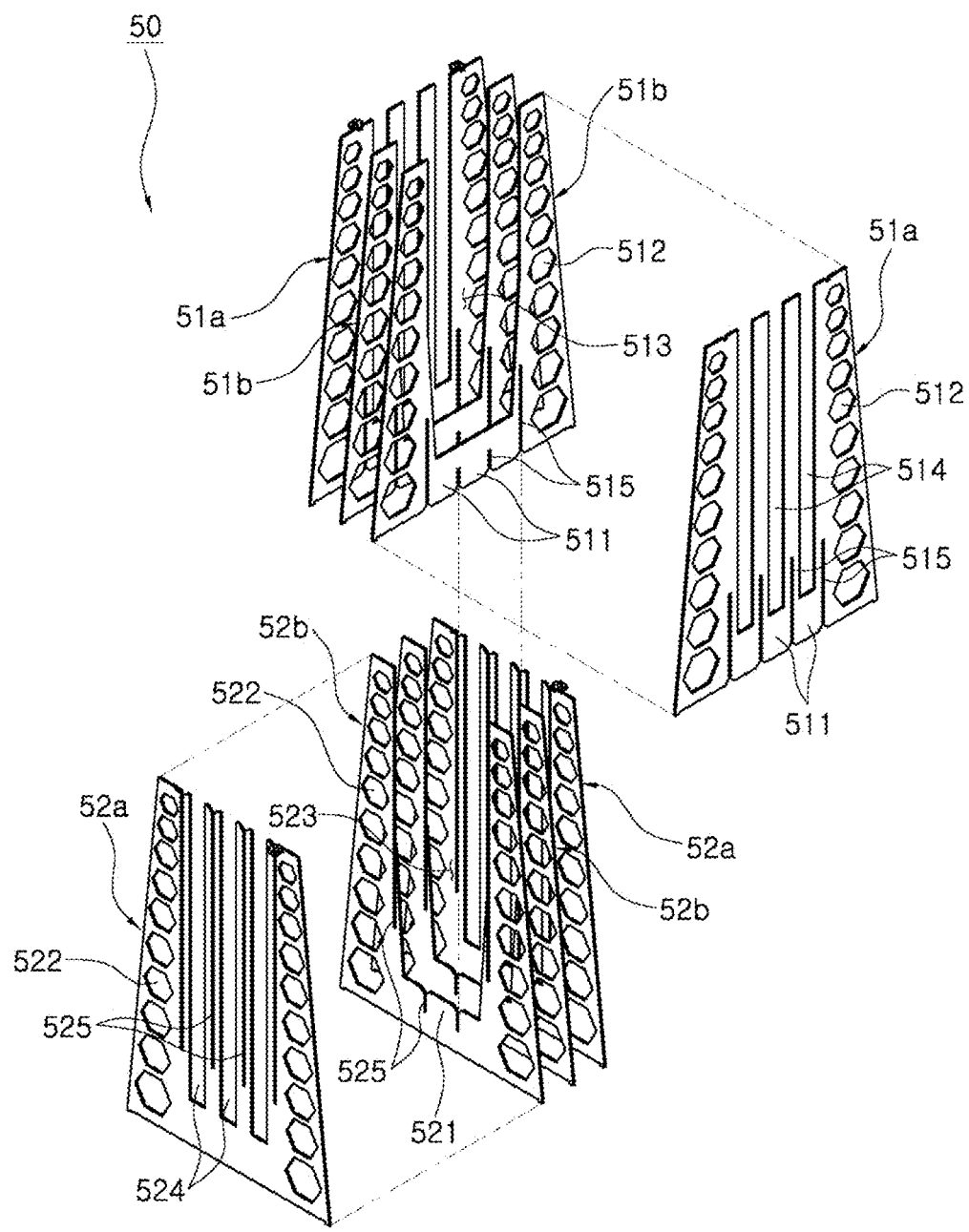
FIG. 4 is an exploded perspective view illustrating a by-product collecting tower of the apparatus of the present invention.
Figure 5:
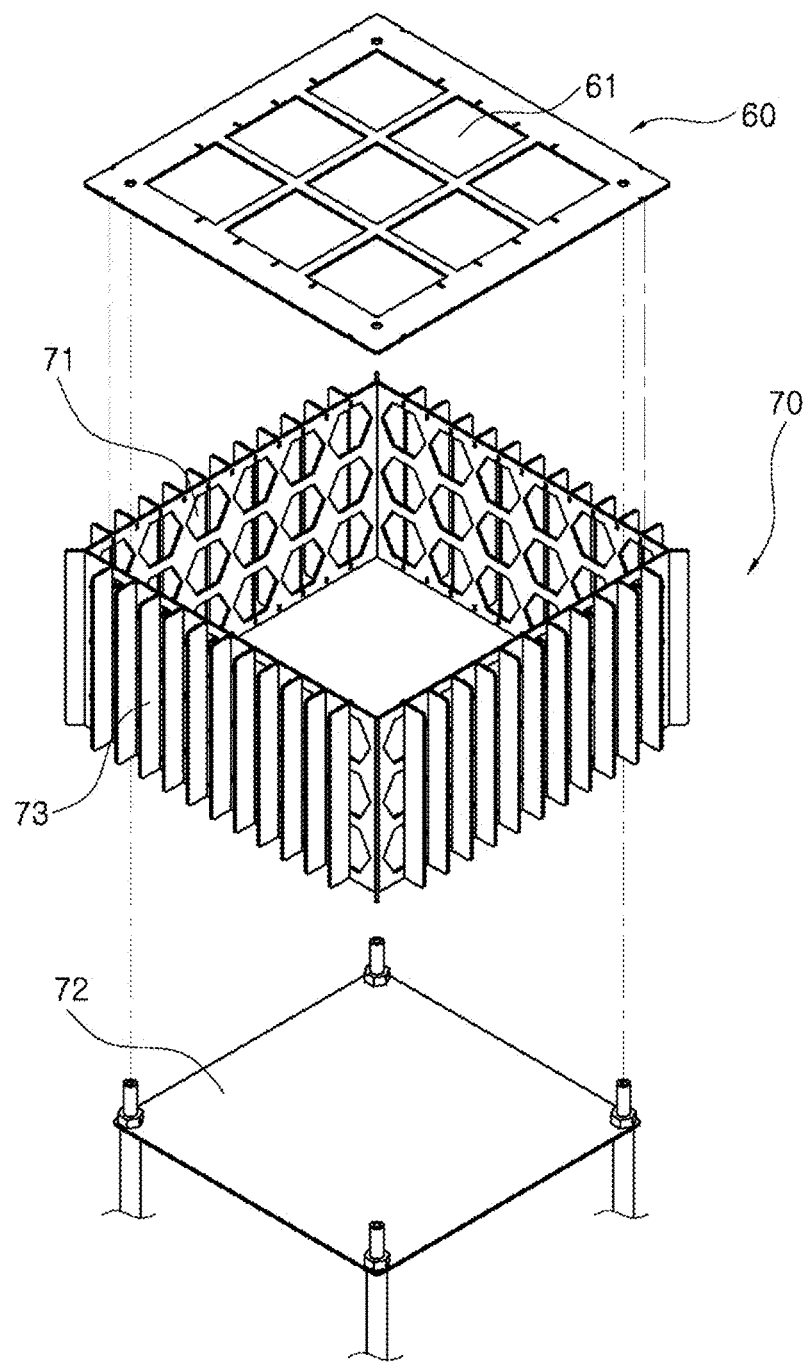
FIG. 5 is an exploded-perspective view illustrating a window of the apparatus of the present invention.
Figure 6:
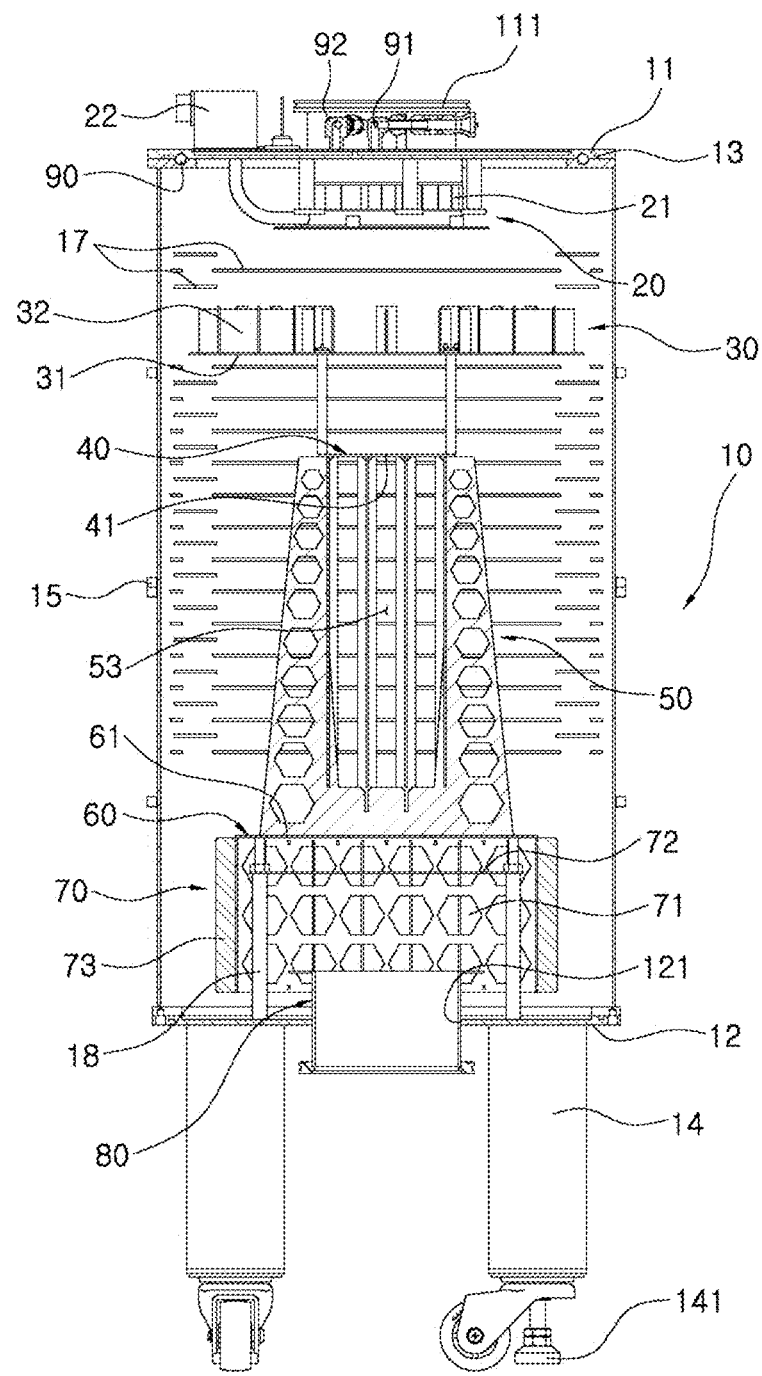
FIG. 6 is a front sectional view illustrating the apparatus for collecting a by-product in a semiconductor process according to the present invention.
Figure 8A:
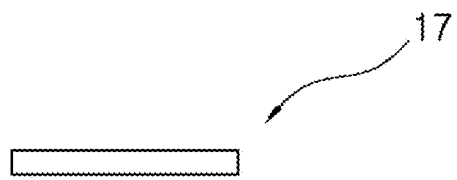
FIGS. 8A to 8E are side cross-sectional views each illustrating an embodiment of a vortex generating plate of the apparatus according to the present invention.
Figure 8B:
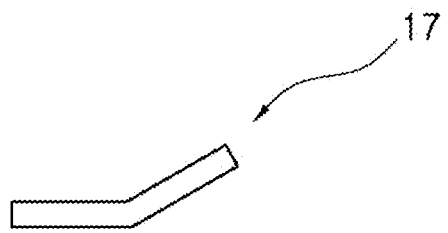
Figure 8C:
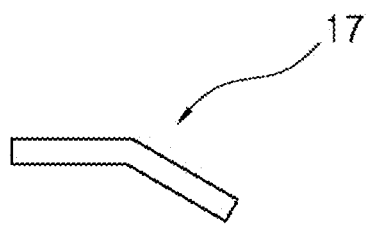
Figure 8D:
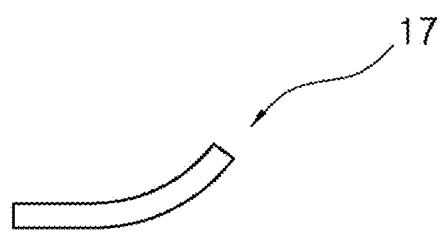
Figure 8E:
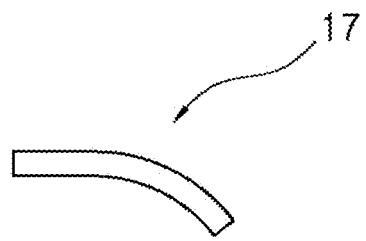

FIG. 4 is an exploded perspective view illustrating a by-product collecting tower of the apparatus of the present invention; FIG. 5 is an exploded-perspective view illustrating a window of the apparatus of the present invention; and FIG. 6 is a front sectional view illustrating the apparatus for collecting a by-product in a semiconductor process according to the present invention.

FIGS. 7A and 7B are a side view and a front view respectively illustrating an exhaust gas flow diagram in which an exhaust gas flows and is vortexed in an evenly distributed manner and by-products are collected in the apparatus for collecting a by-product in a semiconductor process according to the present invention; FIGS. 8A to 8E are side cross-sectional views each illustrating an embodiment of a vortex generating plate of the apparatus according to the present invention; and FIGS. 9A to 9D are photographs respectively showing by-products collected on a bottom surface of an upper plate of a heater plate, on the front and the inside of a by-product collecting tower, and on the outside of the window, after collecting by-products through the apparatus for collecting a by-product in a semiconductor process according to the present invention.

According to the embodiment of the present invention, there is provided an apparatus for collecting a by-product in a semiconductor process, the apparatus provided on a line between a process chamber and a vacuum pump to collect a by-product in an exhaust gas, which is produced in the process chamber. The apparatus includes:

a housing 10 provided with a gas inlet 111 and a gas outlet 121 respectively provided on an upper plate 11 and a lower plate 12, which are detachably coupled to upper and lower openings respectively, and configured with a passage through which gas exhausted from the process chamber flows;

a heater plate 20 made of ceramic or inconel material, provided with multiple heat-dissipation fins 21, which are arranged radially with respect to a vertical direction, provided on a bottom surface of the upper plate 11, and heating an exhaust gas to supply energy required for chemically changing the exhaust gas introduced through the gas inlet 111 of the upper plate 11 and distributing the exhaust gas evenly in an inner space of the housing 10;

a heater power supply unit 22 provided at a side of the upper plate 11 of the housing 10 to supply a power to the heater plate 20;

a first upper horizontal bracket 30 having multiple by-product collecting members 32, which are fixed on an upper surface of a quadrangular plate 31 having a relatively large-diameter vertical mass gas passing opening 311 at the center thereof in a radial direction with respect to the center point, allowing most of the exhaust gas introduced to the housing 10 through the gas inlet 111 of the upper plate 11 to pass therethrough in the vertical direction, partly distributing the remaining exhaust gas evenly in the horizontal direction, and collecting a part of the by-product in a powder form;

a second upper horizontal bracket 40 having multiple minute gas passing holes 42, which have a relatively small diameter and formed at an outer circumference of a relatively large-area vertical mass gas passing opening 41 formed at the center thereof, disposed to be spaced apart a predetermined distance from the bottom of the first upper horizontal bracket 30 by multiple supporters 18 to evenly distribute the exhaust gas introduced through the first upper horizontal bracket 30 in the horizontal and vertical directions and to collect a part of the by-product in a powder form;

a by-product collecting tower 50 having a pyramid shape whose four sides are inclined in which isosceles trapezoidal shaped-multiple first and second directional vertical plates 51a, 51b, 52a, and 52b having multiple vertical gas passing holes 512 and 522 formed only on a portion exposed to the outside when the vertical plates are engaged with each other are assembled in a lattice form in a manner that intersects each other in a direction of 90 degrees by connecting pieces 511 and 521 partly left in bottom portions thereof for engagement, having a structure in which an exhaust gas passing space 53 is formed into a hollow in most of a central upper portion of the by-product collecting tower 50, disposed between the second upper horizontal bracket 40 and a lower horizontal bracket 60 to allow most of the exhaust gas introduced through the second upper horizontal bracket 40 to pass through the exhaust gas passing space 53 and to allow the remaining exhaust gas to flow on the isosceles trapezoidal shaped-multiple first and second directional vertical plates 51a, 51b, 52a, and 52b, and collecting a part of the by-product in a powder form;

the lower horizontal bracket 60 having multiple rectangular shaped-gas holes 61 formed in a number of rows in horizontal and vertical directions, provided fixedly between a lower surface of the by-product collecting tower 50 and an upper surface of a window 70 in the horizontal direction, guiding the exhaust gas vertically introduced through the by-product collecting tower 50 toward the window 70, and collecting a part of the by-product contained in the exhaust gas in a powder form;

the window 70 having a structure in which four rectangular plates having multiple gas suction holes 71 are assembled in a rectangular shape with upper and lower surfaces opened, configured such that an upper opening thereof is fixed to the lower horizontal bracket 60 and a bottom surface thereof is spaced a predetermined distance apart from the lower plate 12 of the housing 10 by the multiple supporters 18, and having an exhaust gas vertical flow-in blocking plate 72 to prevent the exhaust gas passing through the lower horizontal bracket 60 from flowing directly toward a gas collecting and discharging port 80 in the horizontal direction at an upper portion of the supporters 18 such that the by-product that passes through the by-product collecting tower 50 and the lower horizontal bracket 60 or flows in the lateral direction through the inner space of the housing 10 and then is converted into the powder form is blocked from directly introducing toward the gas collecting and discharging port 80 and only the exhaust gas is guided toward the gas collecting and discharging port 80; and the gas collecting and discharging port 80 disposed vertically between the inside of the window 70 and a gas discharge opening 121 provided on the lower plate 12 of the housing 10, and collecting the exhaust gas introduced through the gas holes 61 of the lower horizontal bracket 60, through the gas suction holes 71 of the window 70, and through a gap between the bottom of the window 70 and the lower plate 12 of the housing 10 to discharge outside.

The present invention may further have multiple minute gas passing holes 312, which have a diameter smaller than that of the vertical mass gas passing opening 311 provided on the center of the quadrangular plate 31, on the quadrangular plate 31 of the first upper horizontal bracket 30. Thus, a part of the exhaust gas flowing horizontally along the upper surface of the quadrangular plate 31 of the first upper horizontal bracket 30 flows toward the second upper horizontal bracket 40 and the by-product collecting tower 50 through the multiple minute gas passing holes 312.

In addition, the by-product collecting members 32 disposed on the upper surface of the first upper horizontal bracket 30 may include:

multiple gas flow guiding plates 321 radially arranged in a vertically erected state; and multiple by-product collecting plates 322 crossed at right angles to the gas flow guide plates 321 while being spaced at a predetermined distance from one another.

With respect to the isosceles trapezoidal shaped-multiple first and second directional vertical plates 51a, 51b, 52a, and 52b constituting the by-product collecting tower 50, U-shaped multiple by-product collecting augmenting grooves 513 and 523 may be provided between upper ends and the connecting pieces 511 and 521 of two first and second directional vertical plates 51a and 52a disposed on the front and back sides, and left and right sides, at predetermined distances. In addition, each U-shaped exhaust gas passage groove 514 and 524 may be provided between upper ends and the connecting pieces 511 and 521 of two first and second directional vertical plates 51a and 52a disposed on the inner side. In addition, a notch 515 for inserting the second vertical plate may be vertically upwardly formed from the bottom of the first vertical plates 51a and 51b while keeping a predetermined distance one to another. Furthermore, a notch 525 for inserting the first vertical plate may be vertically downwardly formed at a predetermined distance from the top of the second vertical plates 51a 51b while keeping a predetermined distance one to another.

Multiple by-product collecting augmenting plates 73 may be fixedly provided on the four sides of the window 70, which has the multiple gas suction holes 71, in a vertical direction while keeping a predetermined distance one to another. In addition, the by-product collecting augmenting plates 73 may be disposed to be perpendicular to outer surfaces of the four sides of the window 70.

A cooling pipe 90 through which a coolant flows may be embedded inside the upper plate 11 of the housing 10. In addition, a coolant inlet 91 and a coolant outlet 92 connected to both ends of the cooling pipe 90 respectively may be provided on an upper surface of the upper plate 11. Accordingly, the upper plate 11 is prevented from being overheated due to heat produced from the heater plate 20, whereby a sealing or a gasket 13 provided between upper surface of the housing 10 and the bottom surface of the upper plate 11 is prevented from being damaged and the by-product powder is collected on the bottom surface of the upper plate 11.

Multiple vortex generating plates 17 may further provided, which are installed at a predetermined height from an inner wall of the housing 10 in the vertical direction in order to allow the exhaust gas passing through the inside of the housing 10 to vortex.

Here, the vortex generating plates 17 may be formed to have a side cross-sectional surface among shapes of "-", " ", " ", " ", and " ".

Multiple legs 14, each having a height adjusting bolt/support 141, may be provided at a lower end of the bottom surface of the lower plate 12 of the housing 10 in the vertical direction.

Multiple housing deformation preventing rings 15 may be further provided on an outer surface of the housing 10 at a predetermined distance on the vertical direction, in order to prevent the shape of the housing 10 having a predetermined volume from being deformed by a suction force generated in operation of a vacuum pump.

A pair of handles 16 may be further provided on front and rear surfaces, or both side surfaces of the housing 10.

Operation effects of the apparatus for collecting a by-product in a semiconductor process of the present invention constructed as described above will be described with reference to FIGS. 1 to 9D.

Figure 3:
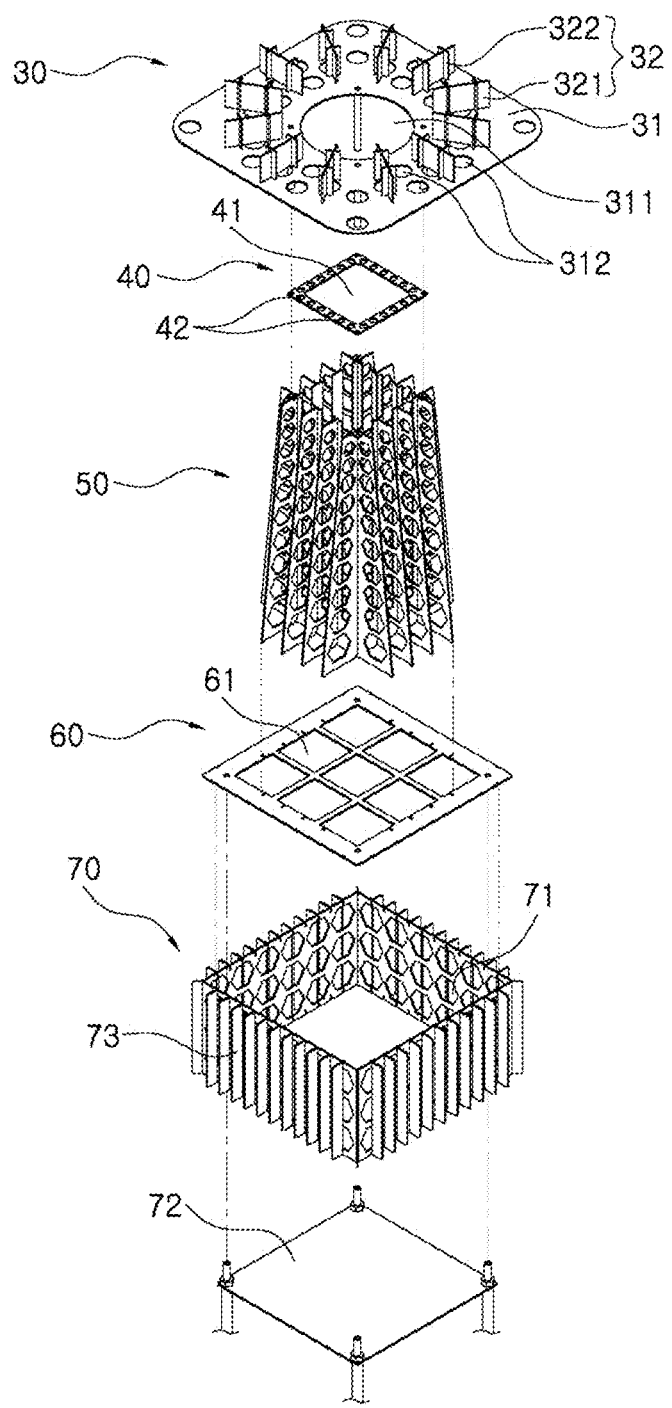
FIG. 3 is an exploded-perspective view partly illustrating the apparatus for collecting a by-product in a semiconductor process according to the present invention.

As shown in FIGS. 1 to 3, in order to simplify the structure and increase the collecting capacity of the by-product greatly, the apparatus is configured to include the housing 10, the heater plate 20, the heater power supply unit 22, the first upper horizontal bracket 30, the second upper horizontal bracket 40, the by-product collecting tower 50, the lower horizontal bracket 60, the window 70, and the gas collecting and discharging port 80. Accordingly, it is possible to greatly extend a replacement period of the apparatus for collecting a by-product in a semiconductor manufacturing apparatus, and to collect by-products quickly and efficiently over a long period of time.

Most of components are made using titanium (Grades 1 to 4), SUS304, SUS316, aluminum, or the like, to prevent corrosion caused by the exhaust gas discharged from the processor chamber.

As shown in FIGS. 1 and 2, among the components, the housing 10 is formed into a hollow rectangular shape having a relatively large volume. Specifically, in the housing 10, the upper opening is detachably coupled to the upper plate 11 having the gas inlet 111 through multiple bolts or the like. In addition, the lower opening is detachably coupled to the lower plate 12 having the gas outlet 121 through multiple bolts or the like. Furthermore, the housing 10 is configured with the passage through which the exhaust gas discharged from the processor chamber for manufacturing a semiconductor flows.

Here, the multiple legs 14, each having the height adjusting bolt/support 141, may be provided at the lower end of the bottom surface of the lower plate 12 of the housing 10 in the vertical direction. Accordingly, it is possible to install the apparatus of the present invention regardless of a place, and easily adjust a level of the housing 10 having a relatively large volume through the height adjusting bolts/supports 141. In particular, it is possible to secure a sufficient space between the floor where the apparatus of the present invention is installed and the bottom surface of the housing 10 such that it is possible to easily connect a vacuum pump (not shown) to the gas collecting and discharging port 80, which will be described later, or to easily separate the vacuum pump from the gas collecting and discharging port 80.

In addition, the multiple housing deformation preventing rings 15 are further provided on the outer surface of the housing 10 at a predetermined distance on the vertical direction such that it is possible to prevent the shape of the housing 10 having a predetermined volume from being deformed due to the suction force generated in operation of the vacuum pump having a strong suction force, thereby enhancing the robustness of the product and significantly extending the service life of the product.

In addition, the pair of handles 16 is further provided on the front and rear surfaces, or both side surfaces of the housing 10 in the present invention such that it is possible to carry and move the apparatus collecting a by-product of the present invention easily and conveniently.

In addition, the heater plate 20 is made of ceramic or inconel material to prevent corrosion caused by the exhaust gas, has the multiple heat-dissipation fins 21, which are arranged radially with respect to the vertical direction, and is detachably provided on the bottom surface of the upper plate 11.

In addition, the heater power supply unit 22 is provided at a side of the upper plate 11 of the housing 10 to smoothly supply power to the heater plate 20 and facilitate maintenance.

As described above, when providing the heater plate 20 and the heater power supply unit 22 on the upper plate 11 of the housing 10 and heating an upper space of the housing 10 including the upper plate 11, the exhaust gas flowing through the gas inlet 111 of the upper plate 11 from the processor chamber passes through the heater plate 20 and causes a chemical change enormously due to the heating. In addition, it is possible to evenly distribute the exhaust gas inside the by-product collecting tower 50 and the housing 10 (including an upper portion of the first and second upper horizontal brackets 30 and 40, which will be described later) through the heat-dissipation fins 21 radially arranged on the upper surface of the heater plate 20.

In addition, as shown in FIG. 3, the first upper horizontal bracket 30, which is one of the components of the apparatus of the present invention, has the vertical mass gas passing opening 311 having a relatively large diameter at the center of the quadrangular plate 31 having a predetermined area. Furthermore, the first upper horizontal bracket 30 has a configuration in which the multiple by-product collecting members 32 are fixed on the upper surface of the quadrangular plate 31 in the radial direction with respect to the center point.

The first upper horizontal bracket 30 is disposed to be spaced a predetermined distance (i.e., height) from the top of the second upper horizontal bracket 40 such that the first upper horizontal bracket 30 allows most of the exhaust gas introduced to the housing 10 through the gas inlet 111 of the upper plate 11 to vertically pass through the vertical mass gas passing opening 311 having a relatively large diameter, partly distributes the remaining exhaust gas evenly in the horizontal direction, and collects a part of the by-product in a powder form.

In addition, the present invention may further have the multiple minute gas passing holes 312, which have a diameter smaller than that of the vertical mass gas passing opening 311 provided on the center of the quadrangular plate 31, on the quadrangular plate 31 of the first upper horizontal bracket 30.

Therefore, a part of the exhaust gas flowing horizontally on the upper surface of the quadrangular plate 31 of the first upper horizontal bracket 30 along a space provided between the by-product collecting members 32 flows toward the second upper horizontal bracket 40 and the upper surface of the by-product collecting tower 50 through the multiple minute gas passing holes 312 by the suction forces of the exhaust gas and the vacuum pump, and the like, whereby the exhaust gas can be more evenly distributed and thus the efficiency of collecting the by-product using the first upper horizontal bracket 30 can be further increased.

The by-product collecting members 32 disposed on the upper surface of the first upper horizontal bracket 30 and directly collecting most of the by-product have a shape in which the gas flow guiding plates 321 and the multiple by-product collecting plates 322 are assembled to be in a substantially " ✚ " shape in a plan view.

Here, the gas flow guiding plates 321, which are one of the components of the by-product collecting members 32, have a rectangular plate shape having different side lengths and are arranged radially in a state of being vertically erected from the upper surface of the quadrangular plate 31. Accordingly, the gas flow guiding plates 321 serves to guide the introduced exhaust gas to be distributed evenly in the vertical direction and serves to collect the by-product, which is changed into a powder form.

In addition, the multiple by-product collecting plates 322, which are one of the components of the by-product collecting members 32, have a rectangular plate shape having a side length shorter than that of the gas flow guiding plates 321 and have a configuration crossed at right angles to the gas flow guiding plates 321 while being spaced at a predetermined distance from one another. Accordingly, the exhaust gas flowing in the horizontal direction bumps into the multiple by-product collecting plates 322 having a large frictional force and a diffracting force whereby the multiple by-product collecting plates 322 serves to collect as much as possible the by-product having a powder form on a surface thereof and a surface of the gas flow guiding plates 321.

In addition, as shown in FIG. 3, the second upper horizontal bracket 40 of the apparatus of the present invention has the vertical mass gas passing opening 41 having a relatively large area at the center thereof, and has the multiple minute gas passing holes 42 having a relatively small diameter and formed in rectangular plates at the outer circumference of the vertical mass gas passing opening 41.

The second upper horizontal bracket 40 is fixed on the upper surface of the by-product collecting tower 50 horizontally, specifically, disposed to be spaced apart a predetermined distance (i.e., height) from the bottom of the first upper horizontal bracket 30 by the multiple supporters 18.

Accordingly, the second upper horizontal bracket 40 allows most of the exhaust gas introduced through the first upper horizontal bracket 30 to evenly flow toward the by-product collecting tower 50 in the vertical direction through the vertical mass gas passing opening 41 of the second upper horizontal bracket 40 and the multiple minute gas passing holes 42, and partly distributes the remaining exhaust gas evenly in the horizontal direction (i.e., laterally distributes along the upper surfaces). Thus, a temperature of the exhaust gas is lowered to an extent such that the second upper horizontal bracket 40 serves to collect a part of the by-product on the surface thereof in a powder form.

As shown in FIGS. 2 to 4, the by-product collecting tower 50, which is one of the components of the apparatus of the present invention, has a pyramid shape whose four sides are inclined and have high heights in which the isosceles trapezoidal shaped-multiple first and second directional vertical plates 51a, 51b, 52a, and 52b having the multiple vertical gas passing holes 512 and 522 formed only on a portion exposed to the outside when the vertical plates are engaged with each other are assembled in a lattice form in a manner that intersects each other in a direction of 90 degrees by the connecting pieces 511 and 521 partly left in the bottom portions thereof for engagement, and has a structure in which the exhaust gas passing space 53 is formed into a hollow in most of the central upper portion of the by-product collecting tower 50.

The by-product collecting tower 50 is disposed between the second upper horizontal bracket 40 and the lower horizontal bracket 60 to allow most of the exhaust gas introduced in the vertical direction through the vertical mass gas passing opening 41 and the multiple minute gas passing holes 42 provided on the second upper horizontal bracket 40 or introduced in the lateral direction through the inner space of the housing 10 to pass the exhaust gas passing space 53, and to allow the remaining exhaust gas to flow on the isosceles trapezoidal shaped-multiple first and second directional vertical plates 51a, 51b, 52a, and 52b. As a result, by-product collecting tower 50 serves to lower a temperature of the exhaust gas, and to collect a part of the by-product in a powder form through peripheries of the vertical gas passing holes 512 and 522 and through the by-product collecting augmenting grooves 513 and 523, as well as on surfaces of the first and second directional vertical plates 51a, 51b, 52a, and 52b.

Regarding to manufacturing the by-product collecting tower 50, with respect to the isosceles trapezoidal shaped-multiple first and second directional vertical plates 51a, 51b, 52a, and 52b, the U-shaped multiple by-product collecting augmenting grooves 513 and 523 are provided between upper ends and the connecting pieces 511 and 521 of two first and second directional vertical plates 51a and 52a disposed at the outermost positions of the front and back sides, and left and right sides. Accordingly, a contact area of the exhaust gas flowing along the two first and second directional vertical plates 51a and 52a disposed at the outermost positions of the front and back sides, and left and right sides is greatly increased as the exhaust gas is exposed to the by-product collecting augmenting grooves 513 and 523, whereby the efficiency of collecting various kinds of by-products produced in semiconductor manufacturing can be greatly increased.

In addition, in the present invention, with respect to the isosceles trapezoidal shaped-multiple first and second directional vertical plates 51a, 51b, 52a, and 52b, each U-shaped exhaust gas passage groove 514 and 524 is provided between the upper ends and the connecting pieces 511 and 521 of the two first and second directional vertical plates 51a and 52a disposed on the inner side, and formed to have a width longer than those of the by-product collecting augmenting grooves 513 and 523. Accordingly, an area of the exhaust gas passing space 53 provided in the center of the pyramidal by-product collecting tower 50 can be increased, whereby the collected amount of the by-products that pass through the by-product collecting tower 50 and change into the powder form can be greatly increased.

Furthermore, in the present invention, with respect to the isosceles trapezoidal shaped-multiple first and second directional vertical plates 51a, 51b, 52a, and 52b, the notch 515 for inserting the second vertical plate is vertically upwardly formed from the bottom of the first vertical plates 51a and 51b while keeping a predetermined distance one to another, and the notch 525 for inserting the first vertical plate is vertically downwardly formed at a predetermined distance from the top of the second vertical plates 51a 51b while keeping a predetermined distance one to another. Accordingly, among the multiple first and second directional vertical plates 51a, 51b, 52a, and 52b, the two first and second directional vertical plates 51a and 52a, which are disposed at the outermost positions of the front, back, left, and right sides, and 52b, are assembled in a "+" shape at many points of both ends thereof. In addition, the two first and second directional vertical plates 51a and 52a, which are disposed on the inner side, keep a shape in which only a part of the connecting pieces 511 and 521 are crossed in a lattice form at 90 degrees.

Figure 9A:
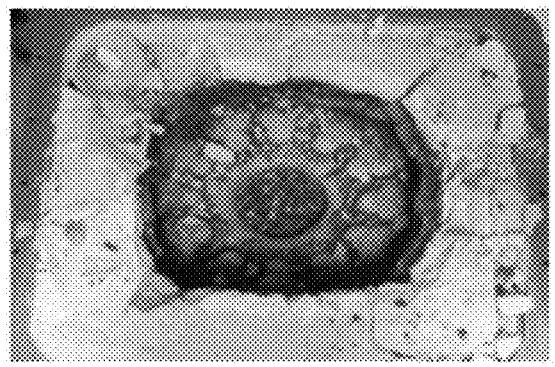
FIGS. 9A to 9D are photographs respectively showing by-products collected on a bottom surface of an upper plate of a heater plate, on the front and the inside of a by-product collecting tower, and on the outside of the window, after collecting by-products through the apparatus for collecting a by-product in a semiconductor process according to the present invention.
Figure 9B:
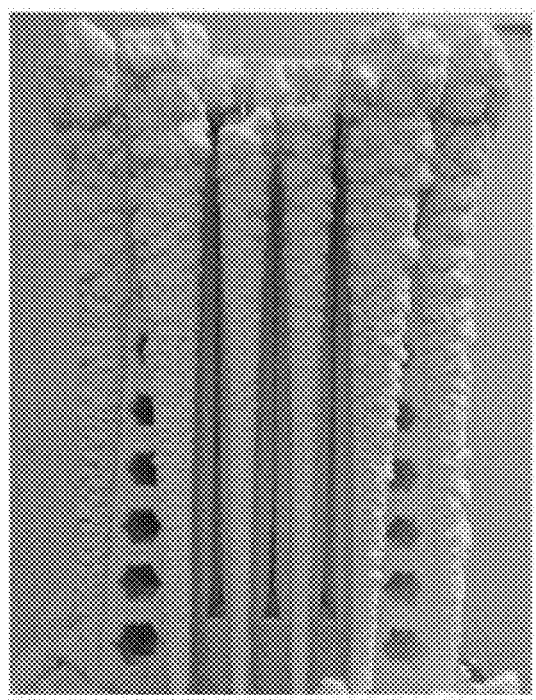

Therefore, the multiple first and second directional vertical plates 51a, 51b, 52a, and 52b have a structure that maintains a large engaging force and allows the exhaust gas to pass smoothly lattice openings formed by the assembling of the exhaust gas passing space 53, which has a relatively large volume, and the connecting pieces 511 and 521. As a result, as shown in FIG. 9B, a part of the semiconductor by-product contained in the exhaust gas is collected on the exhaust gas passing space 53, the outer surfaces of the multiple first and second directional vertical plates 51a, 51b, 52a, and 52b, and the insides of the by-product collecting augmenting grooves 513 and 523 as much as possible due to a temperature difference generated when the exhaust gas passes the exhaust gas passing space 53 and the lattice openings, whereby the efficiency of collecting the by-product can be further maximized.

As shown in FIGS. 3 and 5, the lower horizontal bracket 60, which is one of the components of the present invention, is formed in a rectangular plate in which the multiple rectangular shaped-gas passing holes 61 are formed in a number of rows in horizontal and vertical directions. The lower horizontal bracket 60 is provided fixedly between the lower surface of the by-product collecting tower 50 and the upper surface of the window 70 in the horizontal direction to guide the exhaust gas vertically introduced through the by-product collecting tower 50 toward the window 70 and to collect a part of the by-product on the surface thereof in a powder form by lowering the temperature of the exhaust gas.

As shown in FIGS. 2, 3, and 5, the window 70, which is one of the components of the present invention, has the structure in which the four rectangular plates having the multiple gas suction holes 71 are assembled in a rectangular shape with the upper and lower surfaces opened. In addition, the window 70 is configured such that the upper opening thereof is fixed to the lower horizontal bracket 60 and the bottom surface thereof is spaced a predetermined distance apart from the lower plate 12 of the housing 10 by the multiple supporters 18.

The window 70 is provided with the exhaust gas vertical flow-in blocking plate 72 to be spaced at a predetermined distance from the bottom of the lower horizontal bracket 60, in order to prevent the exhaust gas passing through the lower horizontal bracket 60 from flowing directly toward the gas collecting and discharging port 80 in the horizontal direction at the upper portion of the supporters 18.

The window 70 blocks the by-product that passes through the by-product collecting tower 50 and the lower horizontal bracket 60 or flows in the lateral direction through the inner space of the housing 10 and then is converted into the powder form from being directly introducing toward the gas collecting and discharging port 80, and guides only the exhaust gas toward the gas collecting and discharging port 80. As a result, the window 70 serves to prevent the gas collecting and discharging port 80 from being clogged by the powder-form by-product and prevent the vacuum pump or the like from being damaged by the by-product.

In addition, the multiple by-product collecting augmenting plates 73 are fixedly provided on the four sides of the window 70, which has the multiple gas suction holes 71, in the vertical direction while keeping a predetermined distance one to another. Furthermore, the by-product collecting augmenting plates 73 are disposed to be perpendicular to the outer surfaces of the four sides of the window 70, and along a center line of a perpendicular direction of the gas suction holes 71 to flow along the inner surface of the housing 10 and along the side surface of the window 70. As shown in FIG. 9, a large amount of by-products (and including the exhaust gas flowing along the inner surface of the housing 10 and the side surfaces of the window 70) contained in the exhaust gas flowing into the window 70 provided with the gas collecting and discharging port 80 through the gas suction holes 71 of the window 70 can be collected as much as possible in a powder form through the by-product collecting augmenting plates 73, leading to increasing of the efficiency of collecting the by-product due to using of the window.

In addition, the gas collecting and discharging port 80, which is one of the components of the apparatus of the present invention has a tubular shape, and is vertically provided between the inside of the window 70 and the gas discharge opening 121 provided on the lower plate 12 of the housing 10.

The gas collecting and discharging port 80 smoothly sucks and collects all exhaust gas, which is introduced through the gas holes 61 of the lower horizontal bracket 60, through the gas suction holes 71 formed on the four sides of the window 70, and through the gap between the bottom of the window 70 and the lower plate 12 of the housing 10, and discharges the exhaust gas to the vacuum pump.

As described above, in case that only the heater plate 20 is provided on the bottom surface of the upper plate 11 of the housing 10 to heat, a solid sealing member or the gasket 13 provided for sealing a contact portion between the upper surface of the housing 10 and the bottom surface of the upper plate 11 may be damaged by a high temperature when the upper plate 11 is heated to the high temperature.

Accordingly, in the present invention, the cooling pipe 90 is embedded inside the upper plate 11 of the housing 10, the coolant inlet 91 and the coolant outlet 92 connected to both ends of the cooling pipe 90 respectively are provided on the upper surface of the upper plate 11.

When providing the cooling pipe 90 inside the upper plate 11 and allowing the coolant to flow through the cooling pipe 90, the upper plate 11 is prevented from being overheated due to the heat generated from the heater plate 20. Accordingly, the sealing or the gasket 13 provided between upper surface of the housing 10 and the bottom surface of the upper plate 11 can be prevented from being damaged. In addition, as the temperature of the upper plate 11 is significantly lowered by the coolant flowing in the cooling pipe 90, the by-product is collected in a powder form on the heater plate 20 as well as on the bottom surface of the upper plate 11 as shown in FIG. 9A. As a result, the collecting efficiency of the apparatus can be further increased.

As shown in FIGS. 8A to 8E, in the present invention, the multiple vortex generating plates 17 are provided by welding or the like, the multiple vortex generating plates 17 installed at a predetermined height from an inner wall of the housing 10 in the vertical direction and formed to have a side cross-sectional surface among shapes of "-", "", "", "", and "".

Therefore, a part of the exhaust gas, which is dispersed in the lateral direction in the housing 10 through the second upper horizontal bracket 40, the outer side of the by-product collecting tower 50, the lower horizontal bracket 60, and the outside of the window 70, and bumps against the inner wall of the housing 10, bumps against the vortex generating plates 17 and is vortexed such that a stagnation time of the exhaust gas in the housing 10 is increased, and thus the efficiency of the collecting the by-product of the exhaust gas can be increased.

Figure 9C:
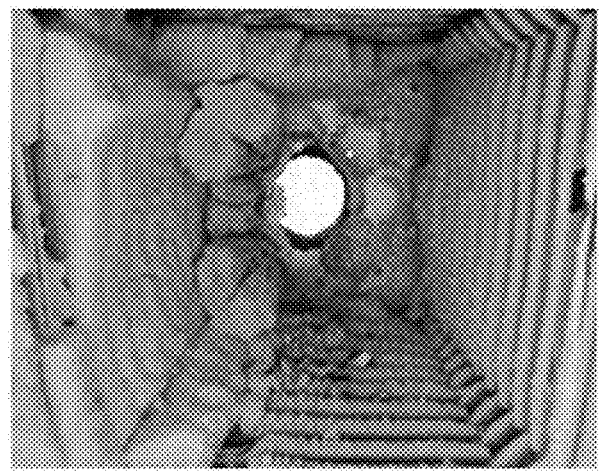
Figure 9D:
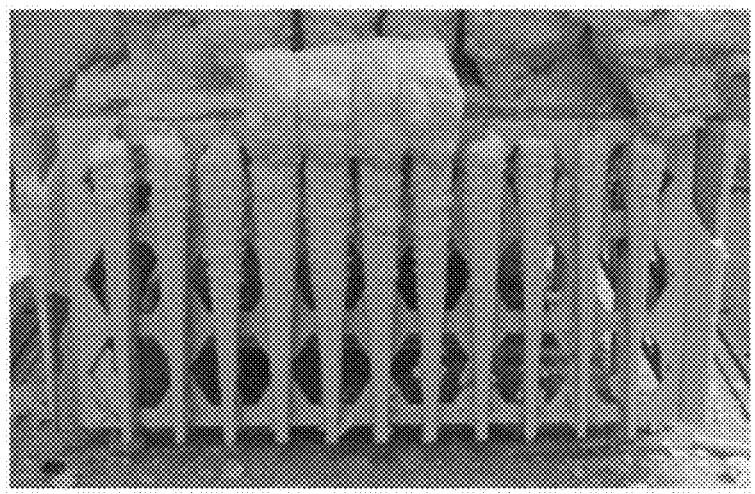
Figure 10:
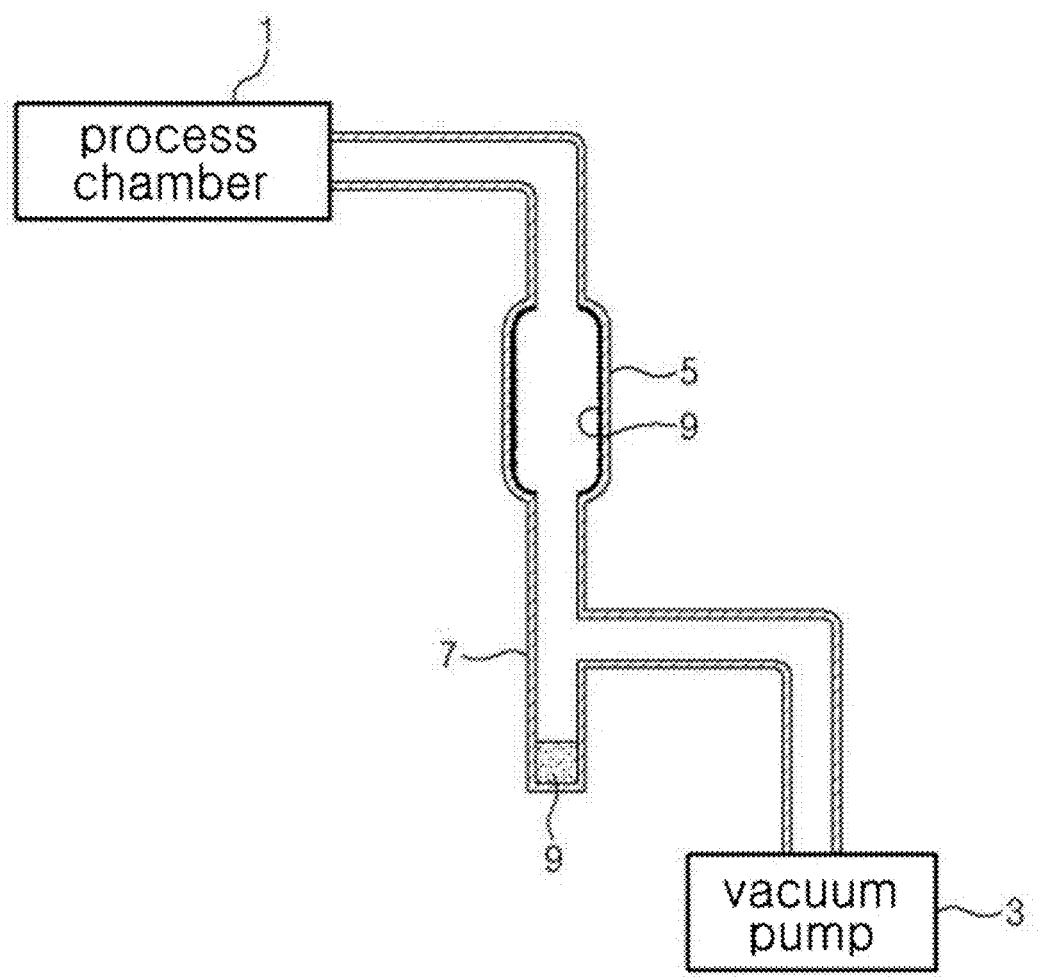
FIG. 10 is a schematic view illustrating a general system for collecting a by-product of the related art.

Particularly, because temperatures of the vortex generating plates 17 integrally provided on the inner wall of the housing 10, which comes into contact with the outside air having a temperature lower than the internal temperature of the housing 10, a large amount of by-products can be collected through the vortex generating plates 17 as shown in FIG. 9C, in addition to through the above-described components (i.e., the heater plate 20, the first upper horizontal bracket 30, the second upper horizontal bracket 40, the by-product collecting tower 50, the lower horizontal bracket 60, and the window 70).

FIGS. 7A and 7B are a side view and a front view each illustrating exhaust gas flows in which the exhaust gas flows and is vortexed in an evenly distributed manner and by-product are collected in the apparatus for collecting a by-product in a semiconductor process according to the present invention.

As described, the apparatus for collecting a by-product of the present invention can significantly increase collecting capacity and efficiency thereof, leading to extension of a replacement period of the apparatus for collecting a by-product in a semiconductor manufacturing apparatus. Thus, it is possible to reduce delay in semiconductor manufacturing process and reduce production costs. In addition, the apparatus can collect a large amount of by-products quickly and efficiently over a long period of time. As a result, the efficiency of collecting various kinds of by-products produced in semiconductor manufacturing, and the productivity and reliability of semiconductor manufacturing can be greatly improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for collecting a by-product in a semiconductor process, the apparatus provided on a line between a process chamber and a vacuum pump to collect a by-product in an exhaust gas, which is produced in the process chamber, the apparatus including:
    a housing provided with a gas inlet and a gas outlet respectively provided on an upper plate and a lower plate, which are detachably coupled to upper and lower openings respectively, and configured with a passage through which gas exhausted from the process chamber flows;
    a heater plate provided with multiple heat-dissipation fins, which are arranged radially with respect to a vertical direction, provided on a bottom surface of the upper plate, and heating an exhaust gas to supply energy required for chemically changing the exhaust gas introduced through the gas inlet of the upper plate and distributing the exhaust gas evenly inside the housing;
    a heater power supply unit supplying a power to the heater plate;
    a first upper horizontal bracket having multiple by-product collecting members, which are fixed on an upper surface of a quadrangular plate having a vertical mass gas passing opening at the center thereof in a radial direction with respect to the center point, allowing most of the exhaust gas introduced to the housing through the gas inlet of the upper plate to pass therethrough in the vertical direction, partly distributing the remaining exhaust gas evenly in the horizontal direction, and collecting a part of the by-product in a powder form;
    a second upper horizontal bracket having multiple minute gas passing holes, which have a relatively small diameter and formed at an outer circumference of a relatively large-area vertical mass gas passing opening formed at the center thereof, disposed to be spaced apart a predetermined distance from the bottom of the first upper horizontal bracket by multiple supporters to evenly distribute the exhaust gas introduced through the first upper horizontal bracket in the horizontal and vertical directions and to collect a part of the by-product in a powder form;

a by-product collecting tower having a pyramid shape whose four sides are inclined in which isosceles trapezoidal shaped-multiple first and second directional vertical plates having multiple vertical gas passing holes formed only on a portion exposed to the outside when the vertical plates are engaged with each other are assembled in a lattice form in a manner that intersects each other in a direction of 90 degrees by connecting pieces partly left in bottom portions thereof for engagement, having a structure in which an exhaust gas passing space is formed into a hollow in most of a central upper portion of the by-product collecting tower, disposed between the second upper horizontal bracket and a lower horizontal bracket to allow most of the exhaust gas introduced through the second upper horizontal bracket to pass through the exhaust gas passing space and to allow the remaining exhaust gas to flow on the isosceles trapezoidal shaped-multiple first and second directional vertical plates, and collecting a part of the by-product in a powder form;

the lower horizontal bracket having multiple rectangular shaped-gas holes formed in a number of rows in horizontal and vertical directions, provided fixedly between a lower surface of the by-product collecting tower and an upper surface of a window, guiding the exhaust gas vertically introduced through the by-product collecting tower toward the window, and collecting a part of the by-product contained in the exhaust gas in a powder form;

the window having a structure in which four rectangular plates having multiple gas suction holes are assembled in a rectangular shape with upper and lower surfaces opened, configured such that an upper opening thereof is fixed to the lower horizontal bracket and a bottom surface thereof is spaced a predetermined distance apart from the lower plate of the housing by the multiple supporters, and having an exhaust gas vertical flow-in blocking plate to prevent the exhaust gas passing through the lower horizontal bracket from flowing directly toward a gas collecting and discharging port in the horizontal direction at an upper portion of the supporters such that the by-product that passes through the by-product collecting tower and the lower horizontal bracket or flows in the lateral direction through the inner space of the housing and then is converted into the powder form is blocked from directly introducing toward the gas collecting and discharging port and only the exhaust gas is guided toward the gas collecting and discharging port; and the gas collecting and discharging port disposed vertically between the inside of the window and a gas discharge opening provided on the lower plate of the housing, and collecting the exhaust gas introduced through the gas holes of the lower horizontal bracket, through the gas suction holes of the window, and through a gap between the bottom of the window and the lower plate of the housing to discharge outside.

2. The apparatus of claim 1, further comprising: multiple minute gas passing holes, which have a diameter smaller than that of the vertical mass gas passing opening provided on the center of the quadrangular plate, on the quadrangular plate of the first upper horizontal bracket such that a part of the exhaust gas flowing horizontally along the upper surface of the quadrangular plate of the first upper horizontal bracket flows toward the second upper horizontal bracket and the by-product collecting tower through the multiple minute gas passing holes.

3. The apparatus of claim 1, wherein the by-product collecting members disposed on the upper surface of the first upper horizontal bracket include:
multiple gas flow guiding plates radially arranged in a vertically erected state; and
multiple by-product collecting plates crossed at right angles to the gas flow guide plates while being spaced at a predetermined distance from one another.

4. The apparatus of claim 1, wherein, with respect to the isosceles trapezoidal shaped-multiple first and second directional vertical plates constituting the by-product collecting tower,
U-shaped multiple by-product collecting augmenting grooves are provided between upper ends and the connecting pieces of two first and second directional vertical plates disposed on the front and back sides, and left and right sides, while keeping a predetermined distance to each other;
each U-shaped exhaust gas passage groove is provided between upper ends and the connecting pieces of two first and second directional vertical plates disposed on the inner side;
a notch for inserting the second vertical plate is vertically upwardly formed from the bottom of the first vertical plates while keeping a predetermined distance one to another; and
a notch for inserting the first vertical plate is vertically downwardly formed at a predetermined distance from the top of the second vertical plates while keeping a predetermined distance one to another.

5. The apparatus of claim 4, further comprising:
multiple by-product collecting augmenting plates fixedly provided on the four sides of the window, which has the multiple gas suction holes, in a vertical direction while keeping a predetermined distance one to another,
wherein the by-product collecting augmenting plates are disposed to be perpendicular to outer surfaces of the four sides of the window.

6. The apparatus of claim 1, further comprising:
a cooling pipe through which a coolant flows embedded inside the upper plate of the housing, and
a coolant inlet and a coolant outlet connected to both ends of the cooling pipe respectively and provided on an upper surface of the upper plate such that the upper plate is prevented from being overheated due to heat produced from the heater plate, whereby a sealing or a gasket provided between upper surface of the housing and the bottom surface of the upper plate is prevented from being damaged and the by-product powder is collected on the bottom surface of the upper plate.

7. The apparatus of claim 1, further comprising:
multiple vortex generating plates, which are installed at a predetermined height from an inner wall of the housing in the vertical direction in order to allow the exhaust gas passing through the inside of the housing to vortex.

* * * * *